(12) United States Patent
Chang et al.

(10) Patent No.: US 9,489,007 B2
(45) Date of Patent: Nov. 8, 2016

(54) CONFIGURABLE CLOCK INTERFACE DEVICE

(71) Applicant: MACRONIX INTERNATIONAL CO., LTD., Hsinchu (TW)

(72) Inventors: Kuen-Long Chang, Taipei (TW); Ken-Hui Chen, Hsinchu (TW); Chang-Ting Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 85 days.

(21) Appl. No.: 14/448,573

(22) Filed: Jul. 31, 2014

(65) Prior Publication Data

US 2015/0293556 A1    Oct. 15, 2015

Related U.S. Application Data

(60) Provisional application No. 61/979,011, filed on Apr. 14, 2014, provisional application No. 62/003,750, filed on May 28, 2014.

(51) Int. Cl.
| | |
|---|---|
| G06F 1/08 | (2006.01) |
| G11C 17/16 | (2006.01) |
| G11C 17/18 | (2006.01) |
| G06F 1/10 | (2006.01) |
| G11C 7/22 | (2006.01) |

(52) U.S. Cl.
CPC . *G06F 1/08* (2013.01); *G06F 1/10* (2013.01); *G11C 7/222* (2013.01); *G11C 7/225* (2013.01); *G11C 17/16* (2013.01); *G11C 17/18* (2013.01)

(58) Field of Classification Search
CPC ........... G06F 1/08; G06F 1/10; G11C 7/222; G11C 7/225; G11C 17/16; G11C 17/18
USPC .................................................. 327/291, 298
See application file for complete search history.

(56) References Cited

U.S. PATENT DOCUMENTS

| | | | | |
|---|---|---|---|---|
| 5,274,678 A * | 12/1993 | Ferolito | ................ | H04L 7/0083 327/141 |
| 5,790,609 A | 8/1998 | Swoboda | | |
| 6,025,744 A * | 2/2000 | Bertolet | ............... | H03K 5/1252 327/276 |
| 6,157,265 A * | 12/2000 | Hanjani | ............... | H03K 3/0231 327/298 |
| 6,239,626 B1 * | 5/2001 | Chesavage | ................ | G06F 1/08 327/147 |
| 6,356,123 B1 | 3/2002 | Lee et al. | | |
| 6,650,160 B2 * | 11/2003 | Tanahashi | .............. | H03K 5/131 327/277 |
| 6,751,745 B1 | 6/2004 | Yoshimura et al. | | |
| 7,518,401 B2 * | 4/2009 | Vadi | ..................... | H03K 5/2481 326/41 |
| 7,629,828 B1 * | 12/2009 | Nekl | ......................... | G06F 1/08 327/291 |
| 8,533,517 B2 * | 9/2013 | Gregie | ..................... | G06F 1/08 713/322 |

FOREIGN PATENT DOCUMENTS

EP    2475100 A2    7/2012

* cited by examiner

*Primary Examiner* — Ryan Jager
(74) *Attorney, Agent, or Firm* — Haynes Beffel & Wolfeld LLP

(57) ABSTRACT

A configurable clock circuit on an integrated circuit, such as an integrated circuit memory, can be configured to utilize external multiple phase clocks and external single phase clocks to produce an internal clock signal in a form compatible with the integrated circuit.

17 Claims, 5 Drawing Sheets

CONFIGURABLE CLOCK INTERFACE DEVICE

RELATED APPLICATIONS

This application claims the benefit of U.S. provisional patent application Nos. 61/979,011 filed on 14 Apr. 2014 and 62/003,750 filed on 28 May 2014, both of which are incorporated by reference as if fully set forth herein.

BACKGROUND

1. Technical Field

The present disclosure relates to devices comprising integrated circuits, and clock interfaces for such devices.

2. Description of Related Art

Integrated circuits often include terminals at which an external clock signal is provided to the device. The external clock signal is delivered to internal circuitry through a clock buffer or other clock circuitry.

The process of implementing a system or device that utilizes integrated circuits often includes connecting the integrated circuits to a bus system or other communication structure that provides the external clock signal. Thus, the nature of the external clock signal that is available for use by the integrated circuit can depend on the system in which it will be utilized. It is not always known in advance what type of system, or what type of external clock, may be available.

In a representative integrated circuit, an external clock provided on a dedicated single clock pin is utilized by single-phase clock circuitry on the device to provide the internal clock used to synchronize the circuitry on the integrated circuit with the external bus system. In another representative integrated circuit that may be configured for higher speed operations, a differential external clock provided on a dedicated pair of clock pins is utilized by clock circuitry on the device to provide the internal clock used to synchronize the circuitry on the integrated circuit with the external bus system. When the bus system implements an external clock in a format that does not match the format for which the integrated circuit is configured, then the integrated circuit can be considered incompatible with that system design.

It is desirable to provide technology to address the compatibility problems that arise in this environment.

SUMMARY

Technology is described providing a configurable clock circuit on an integrated circuit that can be configured to utilize multiple terminal clock interfaces, needed for example with external multiple phase clocks, and single terminal clock interfaces needed for example with external single phase clocks, to produce an internal clock signal in a form compatible with internal circuitry. The technology can overcome compatibility issues which arise with the variety of external clock sources that can be encountered.

A memory device is described that includes a configurable clock interface which provides a clock signal to internal circuitry. The internal circuitry can comprise one or more peripheral circuits on the memory device, the memory array, or both peripheral circuits and the memory array. Internal circuitry for the purpose of this description includes circuitry on the integrated circuit. Also, in embodiments including multiple chip packages having more than one integrated circuit sharing a clock signal, internal circuitry for the purpose of this description includes circuitry that inside the packaging of the integrated circuit.

In one aspect, the technology includes a device. The device comprises an integrated circuit having input terminals and internal circuitry. A clock circuit on the integrated circuit provides the internal clock signal to the internal circuitry. Clock inputs on the clock circuit are electrically connected to a plurality of the input terminals. The clock circuit includes a plurality of sub-circuits. Sub-circuits in the plurality are configured to produce respective clock signals using different sets of the plurality of input terminals. A selection circuit on the integrated circuit is responsive to the configuration parameter. The selection circuit selects one of the plurality of sub-circuits to provide its respective clock signal as the internal clock signal, in response to the configuration parameter. The configuration parameter is stored on the integrated circuit in a clock configuration store, which can be implemented using one-time programmable memory, such as fuses or flash memory cells without erase capability. Also, it can be implemented using other types of memory cells.

In embodiments described herein, a first sub-circuit in the plurality of sub-circuits produces its respective clock signal using a single one of the plurality of input terminals at which, for example, a single phase clock might be provided from an external source. A second sub-circuit in the plurality of sub-circuits produces its respective clock signal using two input terminals of the plurality of input terminals at which, for example, a two-phase clock might be provided from an external source.

In embodiments described herein, the sub-circuits in the plurality produce their respective clock signals in a common form, matching that required by the internal circuitry. For example, the internal clock produced by the configurable clock circuit can be a single phase clock, when the configurable clock circuit is configured to use any of the sub-circuits.

In some embodiments, one or more of the sub-circuits converts a multi-phase clock on its corresponding set of the plurality of input terminals into a single phase clock.

Also, a method of operating a device is described utilizing a clock configuration process to configure a clock interface based to satisfy the need for compatibility with a variety of external clock sources that can be encountered.

Other aspects and advantages of the present technology can be seen on review of the drawings, the detailed description and the claims, which follow.

DETAILED DESCRIPTION

A detailed description of embodiments of the present invention is provided with reference to the FIGS. 1-5.

Figure 1:
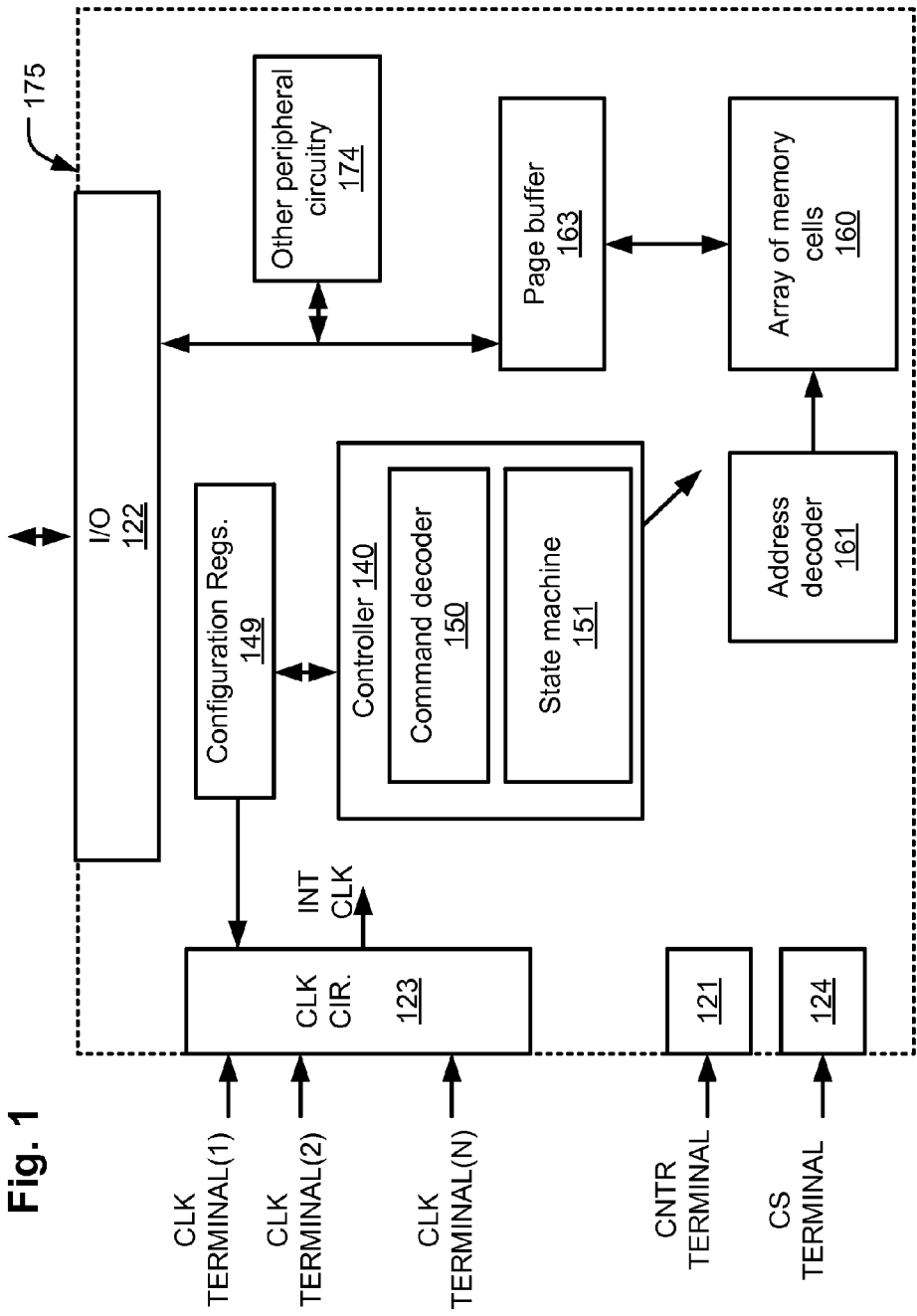
FIG. 1 is a simplified block diagram of the device having a configurable clock circuit as described herein.

FIG. 1 is a simplified block diagram of an integrated circuit 175 that includes a configurable clock circuit 123. A plurality of terminals is connected to the configurable clock circuit 123 (CLK TERMINAL(1) to CLK TERMINAL(N)). In this example, the integrated circuit 175 includes input/output I/O circuits 122 connected to terminals for data and address signals. Also, the integrated circuit includes an input buffer 121 connected to a control signal terminal CNTR. Another input buffer 124 is connected to a terminal for a chip select signal CS.

The terminals can comprise contact pads or contact pins on the integrated circuit, or other connector structures that can act as signal paths from external circuits to internal circuits. For example, integrated circuits are sometimes packaged to facilitate handling and assembly onto printed circuit boards. Pins are provided on such packages providing signal paths to bonding pads on the chip from external circuits on the circuit boards. In some other examples, integrated circuit dies can include pads or bumps configured for direct connections to a substrate. Other connector structures can be used as well to provide terminals on the integrated circuit.

The integrated circuit 175 includes an array 160 of memory cells. The array 160 can comprise a flash memory array configured in a NOR architecture, in a NAND architecture or in other architectures.

An address decoder 161 is coupled to the array 160. Addresses are supplied to the integrated circuit 175 and provided to the address decoder 161. The address decoder 161 can include word line decoders, bit line decoders, and other suitable decoders that decode the supplied addresses and select corresponding memory cells in the array 160.

Bit lines in the array 160 are coupled to a page buffer 163 in this example, which is in turn coupled to other peripheral circuitry 174. The page buffer 163 can include one or more storage elements for each bit line connected. The address decoder 161 can select and couple specific memory cells in the array 160 via respective connecting bit lines to the page buffer 163. The page buffer 163 can then store data that is written to or read from these specific memory cells.

Peripheral circuitry includes circuits that are formed using logic circuits or analog circuits that are not part of the array 160, such as the address decoder 161, the controller 140, and so on. In this example, the block 174 labeled other peripheral circuitry can include circuitry such as a general purpose processor or special-purpose application circuitry, or a combination of modules providing system-on-a-chip functionality supported by the array 160.

The controller 140 provides signals to control other circuits of the integrated circuit 175 to carry out the various operations for reading and writing data in the memory array 160. The controller 140 includes a command decoder 150 and a state machine 151 or other sequential logic circuits. The controller 140 can be implemented using special-purpose logic circuitry as known in the art. In other embodiments, the controller comprises a general purpose processor, which executes a computer program to control the operations of the device. In yet other embodiments, a combination of special purpose logic circuitry and a general purpose processor may be utilized for implementation of the controller.

The integrated circuit 175 also includes configuration registers 149, which are used for a variety of purposes in configuring operation of the device. In this example, the configuration registers 149 include a clock configuration register which is coupled to the configurable clock circuit 123. The configuration registers 149 are examples of a configuration store suitable to providing the configuration parameters to the configurable clock circuit 123.

The configurable clock circuit 123 has a plurality of clock inputs that can receive clock signals from CLK TERMINALS (1) to (N), which are configured to be used by the clock circuit 123 as received clock signals. Other terminals on the device, can be connected to other inputs configured to receive exclusively power, ground, control signals and the like which are not clock inputs configured to be used by the clock circuit as received clock signals.

The configurable clock circuit 123 provides an internal clock INT CLK for the device which is used by at least some of the internal circuitry, such as the controller, the memory array, the page buffer and so on.

The clock circuit 123 can include a plurality of sub-circuits, where the sub-circuits in the plurality are configured to produce respective clock signals using different sets of the plurality of input terminals. The sub-circuits in the clock circuit 123 can be independent circuits, without overlapping components, or in the alternative can utilize at least some common components. For example, the clock inputs of the configurable clock circuit 123 may include amplifiers that are connected directly to the terminals. These amplifiers may be utilized by each of the sub-circuits, and constitute overlapping components. Of course, a wide variety of configurations of the sub-circuits can be implemented.

The clock circuit 123 can include a selection circuit on the integrated circuit responsive to a configuration parameter in the configuration registers 149. Based on the configuration parameter, the selection circuit can select one of the plurality of sub-circuits to provide its respective clock signal as the internal clock signal INT CLK. The selection circuit can comprise the switch or multiplexer operable to select separate outputs for the different sub-circuits, or enable circuits to enable different sub-circuits coupled to a shared output, or combinations of such elements.

The configuration registers 149 include a clock configuration store which provides the configuration parameter to the selection circuit. The clock configuration store can comprise one-time programmable memory elements, such as fuse or flash memory cells without erase circuitry. Also, the clock configuration store can comprise other types of nonvolatile memory. In yet other embodiments, the clock configuration store can comprise SRAM or DRAM memory cells, or other volatile types of memory elements.

Figure 2:
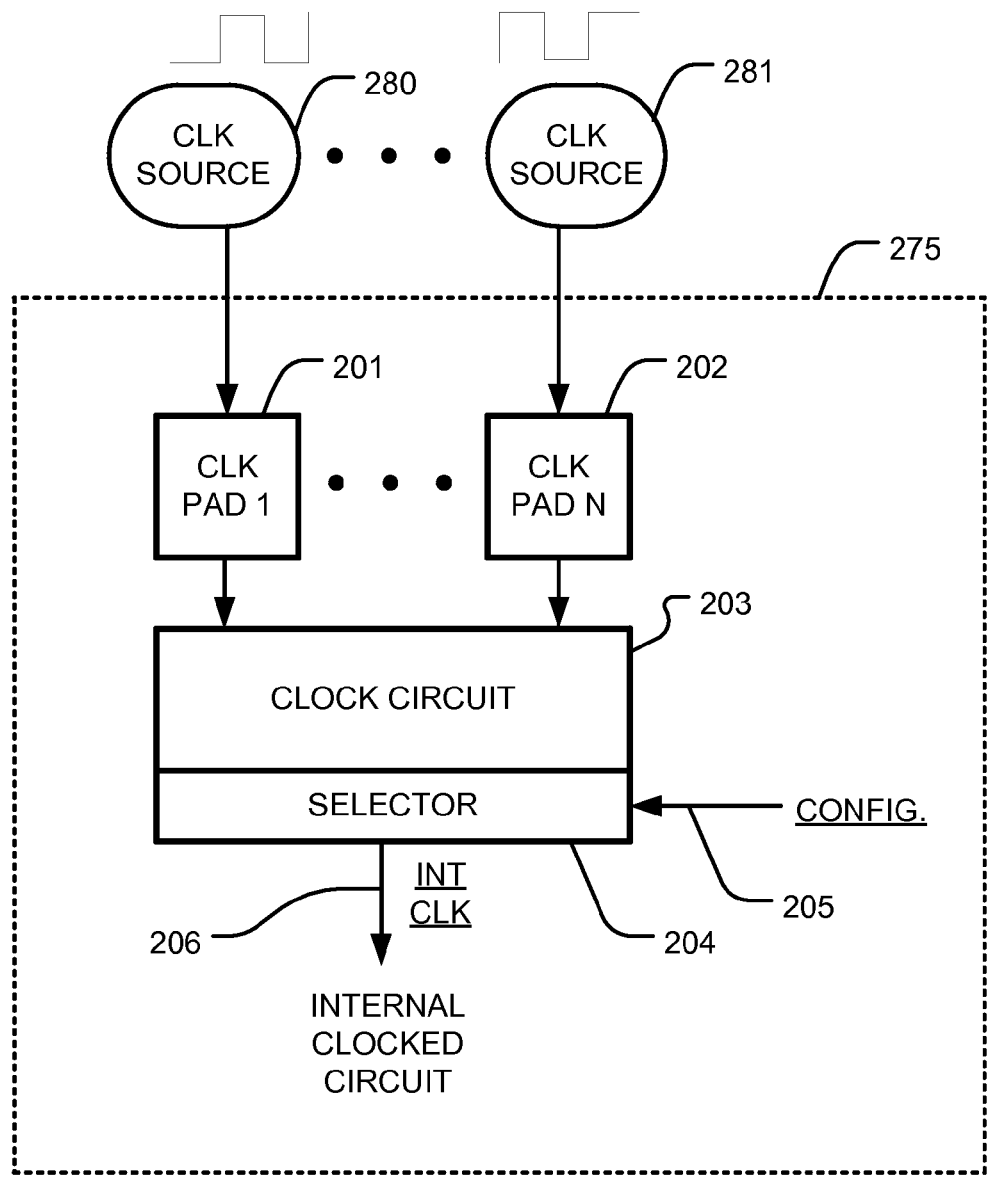
FIG. 2 is a simplified block diagram of a configurable clock circuit suitable for use, for example, on an integrated circuit memory device.

FIG. 2 provides a more detailed diagram of an embodiment of a configurable clock circuit suitable for use in a device including integrated circuits like that of FIG. 1. The box 275 represents the boundaries of the integrated circuit. A plurality of terminals, including clock pad 1 (201) to clock pad N (202) are provided on the integrated circuit. The clock pad 1 (201) to clock pad N (202) are connected to clock sources schematically represented by the elements 280 and 281, or to one or more clock sources, the number and configuration of which can be unknown at the time of manufacturing of the device. Clock pad 1 (201) to clock pad N (202) in return are connected to clock inputs of a clock circuit 203, that is coupled to a selection circuit 204. The output of the selection circuit 204 is an internal clock signal INT CLK on line 206 which is provided to an internal clocked circuit on the integrated circuit. The configuration parameter CONFIG is provided on line 205 to the selection circuit 204, to control which of the sub-circuits of the clock circuit 203 is utilized.

The sub-circuits in the plurality of sub-circuits are configured to produce respective clock signals using different sets of the plurality of input terminals, clock pad 1 (201) to clock pad N (202). For example, one sub-circuit is configured to utilize only clock pad 1 (201), while another sub-circuit is configured to utilize two of the plurality of terminals, such as clock pad 1 (201) and a second clock pad. Sub-circuits can be included that are configured for single phase, two-phase, four-phase, and other multiphase clock inputs which utilize one or more of the terminals. Also, multiple sub-circuits can be included that utilize single phase clock inputs on different terminals. A wide variety of combinations of sub-circuits can be included as suits a particular implementation.

Figure 3:
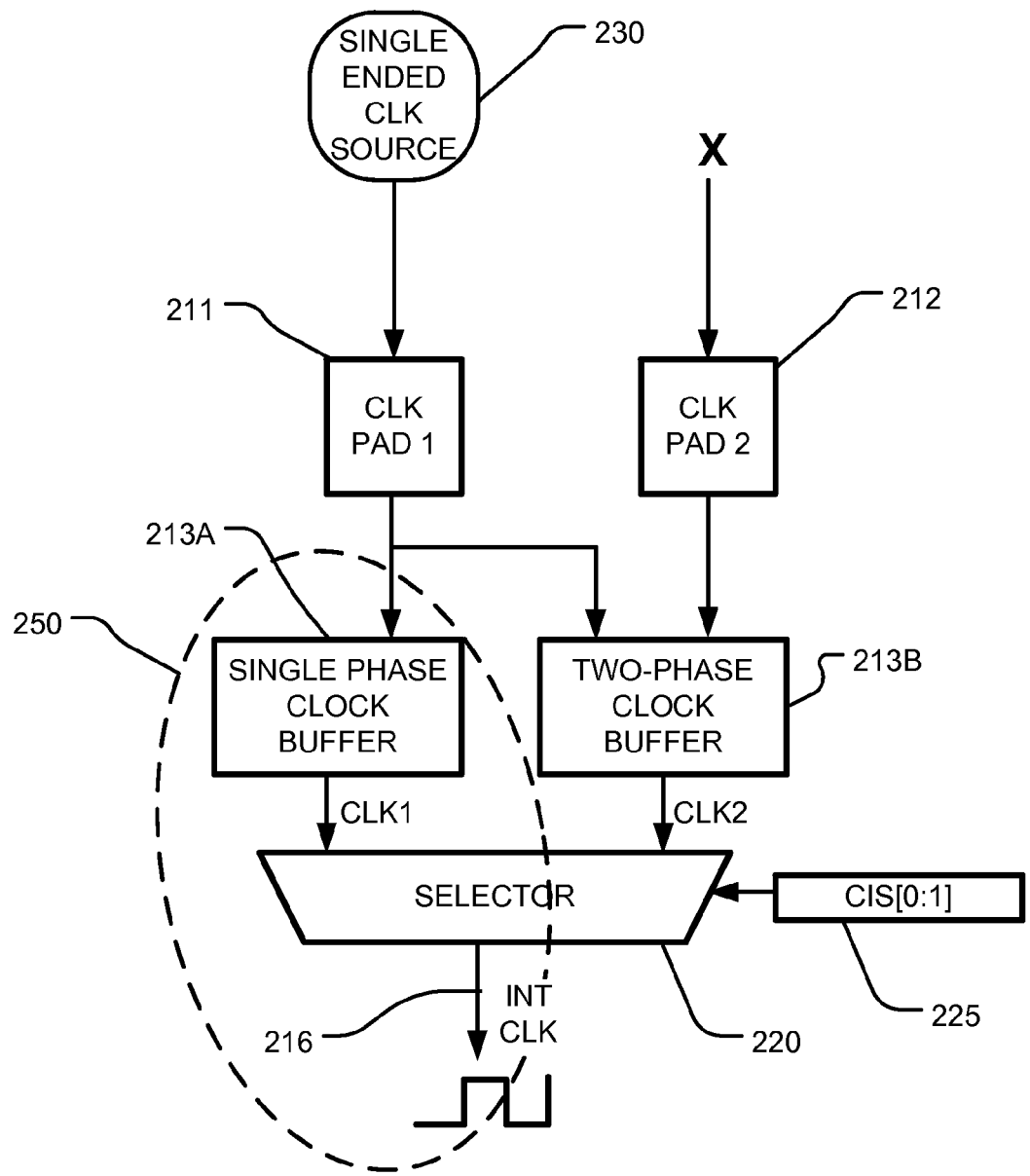
FIG. 3 is a more detailed block diagram of an embodiment of a configurable clock circuit, illustrating one selected configuration.

FIG. 3 is a more detailed diagram of a configurable clock circuit having two terminals: clock pad 1, (211) and clock pad 2 (212). Clock pad 1 (211) is electrically connected to a single phase clock buffer 213A and to a differential, two-phase clock buffer 213B, so that any clock signal delivered to the pad 211 is electrically communicated to both. A differential, two-phase clock can be considered to be a two-phase clock in which the clock phases are 180° out of phase. Other types of two-phase clocks can be utilized as well, including two-phase clocks having different amounts of phase offset. Clock pad 2 (212) is electrically connected to the two-phase clock buffer 213B, so that any clock signal delivered to the pad 212 is electrically communicated only to the two-phase clock buffer 213B.

The single phase clock buffer 213A is configured to produce clock CLK1 while the two-phase clock buffer 213B is configured to produce clock CLK2, both of which are provided to a selector 220. The output of the selector 220 is the internal clock 216 which is applied to the internal circuitry.

The single phase clock buffer 213A and the two-phase clock buffer 213B include circuitry to produce clocks in a common format used by the internal circuitry. In some embodiments, the common format is a single phase clock which can be provided on a single signal line 206. In other embodiments, the common format can be a differential, or two-phase clock, or other multiphase clock configurations. The frequency of the clocks CLK1 and CLK2 can be equal to or different from clock signals provided on the terminals, depending on the circuitry included in the clock buffers 213A, 213B. For example, one or more of the sub-circuits may include clock multiplier circuits to increase the clock rate, or clock divider circuits to decrease the clock rate.

A configuration store 225 stores a clock interface selection CIS parameter CIS[0:1] including two bits in this example. The two bits can be utilized to indicate selection of CLK1 and CLK2.

FIG. 3 illustrates a configuration in which the configurable clock circuit receives a single ended clock from an external source 230 on the clock pad 1 (211). The configuration store is set to select the sub-circuit (including components heuristically indicated by the ellipse 250) which produces CLK1. As indicated by the "X", it does not matter what is connected externally to clock pad 2 (212). The sub-circuit having a clock input coupled to clock pad 2 (212) is not selected in this configuration.

Figure 4:
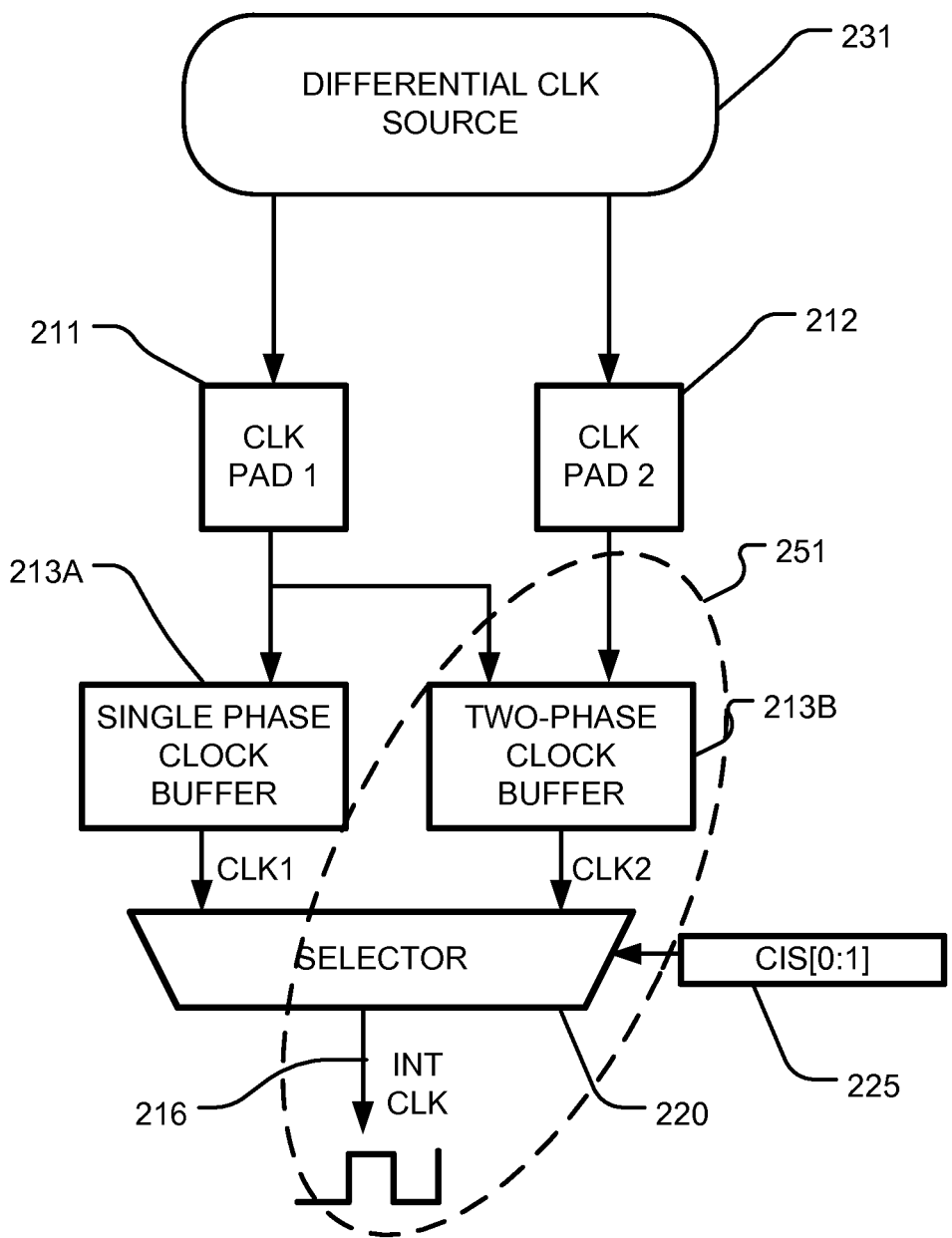
FIG. 4 is a block diagram like FIG. 3, illustrating a different selected configuration.

FIG. 4 is a copy of FIG. 3 modified to illustrate a configuration in which the configurable clock circuit receives a two-phase, differential clock from an external differential clock source 231, utilizing both clock pad 1 (211) and clock pad 2 (212). In this example, the configuration parameter is set to select the sub-circuit (including components heuristically indicated by the ellipse 251) which produces CLK2.

In the embodiment illustrated in FIGS. 3 and 4, the configuration parameters are utilized to control selector 220.

The selector 220 can consist of simple switches, or more complex clock multiplexing circuitry as suits a particular implementation.

Figure 5:
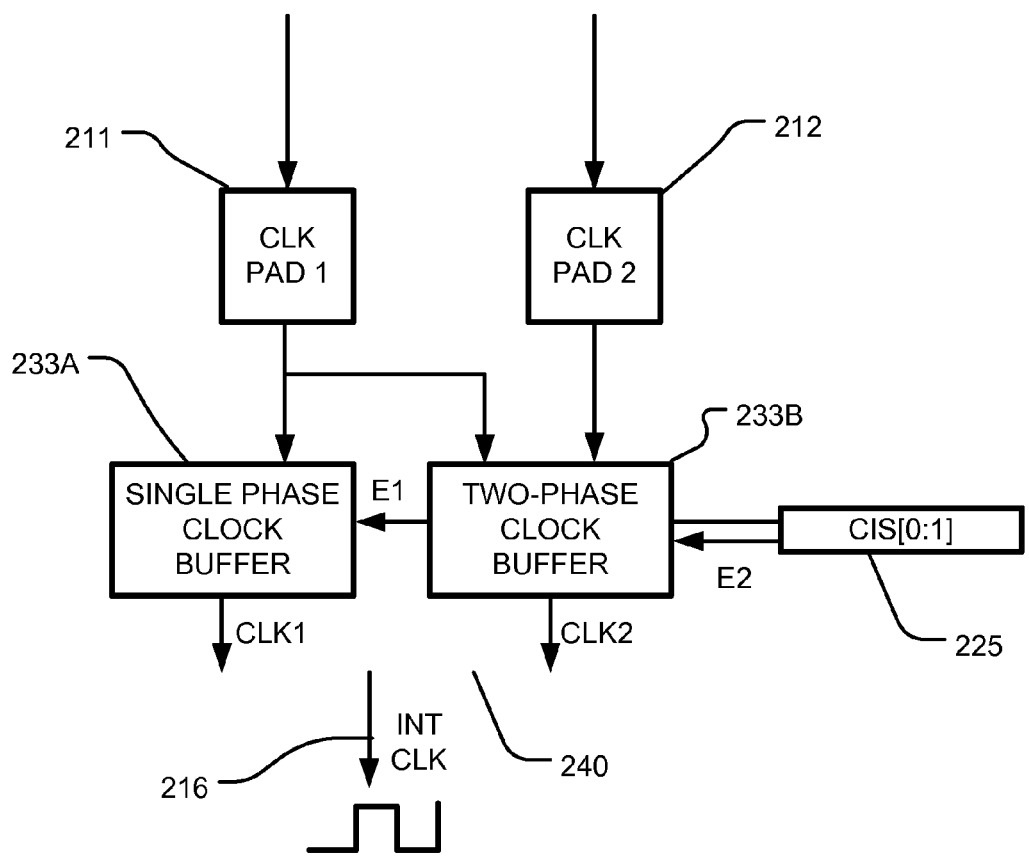
FIG. 5 is a block diagram illustrating an alternative embodiment of a configurable clock circuit.

FIG. 5 illustrates an alternative embodiment which, like FIGS. 3 and 4, includes a configurable clock circuit having two terminals: clock pad 1 (211) and clock pad 2 (212). Clock pad 1 (211) is electrically connected to a single phase clock buffer 233A and to a two-phase clock buffer 233B, so that any clock signal delivered to the pad 211 is electrically communicated to both. Clock pad 2 (212) is electrically connected to the two-phase clock buffer 233B, so that any clock signal delivered to the pad 212 is electrically communicated only to the two-phase clock buffer 233B.

The single phase clock buffer 233A is configured to produce clock CLK1 while the two-phase clock buffer 233B is configured to produce clock CLK2. CLK1 and CLK2 are provided on a wired-OR signal line 240 to provide the internal clock INT CLK on line 206.

The configuration store 225 in this example is utilized to enable or disable a selected one of the sub-circuits. Thus, the outputs of the configuration store include an enable signal E1 electrically connected to the single phase clock buffer 233A, and an enable signal E2 electrically connected to the two-phase clock buffer 233B. Thus a selection circuit in this embodiment includes circuits to enable and disable the clock buffers, and the signal routing 240 of the clocks CLK1 and CLK2.

In other embodiments, a combination of multiplexers or switches on the outputs, like in FIGS. 3 and 4, which enable and disable circuitry, can be utilized as the selection circuit for the configurable clock circuit. In yet other embodiments, the selection circuitry can include switches controlled by parameters in the configuration store, that open and close on the signal paths between the terminals (e.g. clock pad 1 (211) and clock pad 2 (212)) and the clock buffers 233A and 233B.

A method of operating a device, such as an integrated circuit, having input terminals and internal circuitry is provided. The method includes reading a configuration parameter on the device, from for example a one time programmable store on the device. The configuration parameter identifies one of a number of sets of the plurality of input terminals, where the identifiable sets are pre-configured to match the available combinations in the device. Using the configuration parameter, an internal clock signal is produced using the identified set of the plurality of input terminals. The method includes providing the internal clock signal to the clocked internal circuit.

The step of producing the internal clock can include using one of a first sub-circuit, which can includes a single phase clock buffer configured to produce a first clock signal using a single one of the plurality of input terminals, and a second sub-circuit which can include a differential clock buffer configured to produce a second clock signal using two of the plurality of input terminals. One of the first and second clock signals can be selected.

In some examples, the method can provide that the number of sets identifiable by the configuration parameters includes a set identifying a plurality of the input terminals and including producing the internal clock by converting a multi-phase clock on the identified plurality of input terminals into a single phase clock.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising:
    an integrated circuit having input terminals;
    internal circuitry;
    a clock circuit on the integrated circuit to provide an internal clock signal to the internal circuitry, the clock circuit having clock inputs electrically connected to a plurality of the input terminals;
    the clock circuit configurable to produce the internal clock signal using different sets of the plurality of the input terminals in response to a configuration parameter; and
    a clock configuration store which provides the configuration parameter,
    wherein the clock circuit includes a first sub-circuit configured to produce a first clock signal using a single one of the plurality of input terminals, and a second sub-circuit configured to produce a second clock signal using the single one and another one of the plurality of input terminals, the first sub-circuit and the second sub-circuit commonly including an amplifier directly connected to the single one of the plurality of input terminals.

2. The device of claim 1, wherein the clock circuit includes a selection circuit responsive to the configuration parameter to select one of the first and second sub-circuits.

3. The device of claim 1, wherein the first sub-circuit comprises a single phase clock buffer, and the second sub-circuit comprises a multi-phase clock buffer.

4. The device of claim 1, wherein the internal circuitry is on the integrated circuit.

5. The device of claim 1, wherein the integrated circuit comprises a memory array.

6. The device of claim 1, wherein at least one of sub-circuits clock circuit converts a multi-phase clock on a set of the plurality of input terminals into a single phase clock.

7. The device of claim 1, wherein the configuration store comprises a nonvolatile memory.

8. A device, comprising:
    an integrated circuit having input terminals;
    a memory array and internal circuitry on the integrated circuit;
    a clock circuit on the integrated circuit to provide an internal clock signal to the internal circuitry, the clock circuit having clock inputs electrically connected to a plurality of the input terminals;
    the clock circuit including a plurality of sub-circuits, where sub-circuits in the plurality are configured to produce respective clock signals using different sets of the plurality of the input terminals;
    a selection circuit on the integrated circuit, responsive to a configuration parameter, to select one of the plurality of sub-circuits to provide its respective clock signal as the internal clock signal; and
    a clock configuration store which provides the configuration parameter to the selection circuit,
    wherein a first sub-circuit of the plurality of sub-circuits produces a first clock signal using a single one of the plurality of input terminals, and a second sub-circuit of the plurality of sub-circuits produces a second clock signal using the single one and another one of the plurality of input terminals, the first sub-circuit and the second sub-circuit commonly including an amplifier directly connected to the single one of the plurality of input terminals.

9. The device of claim 8, wherein the first sub-circuit comprises a single ended clock buffer to convert a single phase clock on one of the plurality of input terminals to its respective clock signal, and the second sub-circuit comprises a two-phase clock buffer to convert a two-phase clock on two of the plurality of input terminals to its respective clock signal.

10. The device of claim 8, wherein at least one of the sub-circuits in the plurality of sub-circuits converts a multi-phase clock on its set of the plurality of input terminals into a single phase clock.

11. The device of claim 8, wherein the configuration store comprises a nonvolatile memory.

12. A method of operating a device having input terminals and internal circuitry; the method comprising:
    reading a configuration parameter on the device, the configuration parameter identifying one of a number of sets of a plurality of the input terminals;
    producing an internal clock signal using the identified set of the plurality of the input terminals in response to the configuration parameter; and
    providing the internal clock signal to the internal circuitry,
    wherein said producing the internal clock includes using one of a first sub-circuit configured to produce a first clock signal using a single one of the plurality of input terminals, and a second sub-circuit configured to produce a second clock signal using the single one and another one of the plurality of input terminals to deliver a second external clock signal from a second clock source, the first sub-circuit and the second sub-circuit commonly including an amplifier directly connected to the single one of the plurality of input terminals.

13. The method of claim 12, wherein the first sub-circuit comprises a single phase clock buffer, and the second sub-circuit comprises a multi-phase clock buffer.

14. The method of claim 12, wherein the internal circuitry is on an integrated circuit that also includes circuitry which performs said producing.

15. The method of claim 12, wherein the number of sets identifiable by the configuration parameters includes a set identifying a plurality of the input terminals and including producing the internal clock by converting a multi-phase clock on the identified plurality of input terminals into a single phase clock.

16. The method of claim 12, including reading the configuration parameter from a one-time programmable memory on the device.

17. The method of claim 12, including reading the configuration parameter from a nonvolatile memory.

* * * * *